United States Patent
Oh et al.

(10) Patent No.: US 8,760,842 B2
(45) Date of Patent: Jun. 24, 2014

(54) FLEXIBLE MULTILAYER TYPE THIN FILM CAPACITOR AND EMBEDDED PRINTED CIRCUIT BOARD USING THE SAME

(75) Inventors: Young Joo Oh, Seoul (KR); Jung Rag Yoon, Yongin-si (KR); Jeong Woo Han, Seoul (KR)

(73) Assignee: Samhwa Capacitor Co., Ltd. (KR)

( * ) Notice: Subject to any disclaimer, the term of this patent is extended or adjusted under 35 U.S.C. 154(b) by 211 days.

(21) Appl. No.: 13/343,478

(22) Filed: Jan. 4, 2012

(65) Prior Publication Data

US 2012/0168207 A1 Jul. 5, 2012

(30) Foreign Application Priority Data

Jan. 5, 2011 (KR) .................. 10-2011-0001024

(51) Int. Cl.
- *H01G 4/30* (2006.01)
- *H05K 1/16* (2006.01)
- *H01G 4/005* (2006.01)
- *H05K 1/18* (2006.01)

(52) U.S. Cl.
CPC .................. *H01G 4/30* (2013.01); *H05K 1/185* (2013.01); *H01G 4/005* (2013.01)
USPC .................. 361/301.4; 174/254; 174/260

(58) Field of Classification Search
CPC ....... H05K 1/16; H05K 1/0393; H05K 1/185; H05K 1/118; H05K 1/028; H05K 3/28; H05K 3/281; H01G 4/30; H01G 4/306; H01G 4/232; H01G 9/012
USPC .................. 174/254, 260; 361/301.4
See application file for complete search history.

(56) References Cited

U.S. PATENT DOCUMENTS

| 5,576,925 A * | 11/1996 | Gorowitz et al. .......... 361/301.2 |
| 5,599,757 A | 2/1997 | Wilson et al. |
| 2008/0142255 A1 * | 6/2008 | Inagaki et al. ................ 174/260 |
| 2011/0017997 A1 * | 1/2011 | Kamath et al. .................. 257/66 |

\* cited by examiner

*Primary Examiner* — Timothy Thompson
*Assistant Examiner* — Charles Pizzuto
(74) *Attorney, Agent, or Firm* — Cantor Colburn LLP

(57) ABSTRACT

Provided is a flexible multilayer thin film capacitor using a flexible metal substrate, including: a metal substrate; a metal oxide layer formed on the whole surface of the metal substrate; a plurality of first internal electrode layers selectively applied on a first surface of the metal substrate using a metal material; a plurality of dielectric layers formed to be sequentially multi-layered on the whole surface of the first internal electrode layers using a dielectric material; a plurality of second internal electrode layers selectively applied on the dielectric layers using a metal material; a protecting layer applied on a surface of one of the plurality of second internal electrode layers; and a single pair of external electrodes connected to contact with the plurality of first internal electrode layers and the plurality of second internal electrode layers, respectively, and soldered on conductive inter-layer pads of a printed circuit board.

12 Claims, 6 Drawing Sheets

FLEXIBLE MULTILAYER TYPE THIN FILM CAPACITOR AND EMBEDDED PRINTED CIRCUIT BOARD USING THE SAME

CROSS-REFERENCE TO RELATED APPLICATION

This application claims the benefit of Korean Patent Application No. 10-2011-0001024, filed on Jan. 5, 2011 in the Korean Intellectual Property Office, the disclosure of which is incorporated herein by reference.

BACKGROUND OF THE INVENTION

1. Field of the Invention

The present invention relates to a flexible multilayer thin film capacitor and an embedded printed circuit board using the same, and more particularly, a flexible multilayer thin film capacitor using a flexible metal substrate and an embedded printed circuit board using the same.

2. Description of the Related Art

Miniaturization, lightness, and high-functionalization of an electronic product, such as a smart phone and the like, are being actively ongoing. Due to the above trend, a multilayer ceramic capacitor (MLCC) is being developed as a multilayer thin film capacitor using a thin film manufacturing method. The multilayer thin film capacitor is mounted to a printed circuit board to be embedded therein. Hereinafter, a configuration thereof will be described with reference to the accompanying drawings.

As shown in FIG. 1, a multilayer thin film capacitor includes a silicon substrate 1, a dielectric thin film 2, an internal electrode thin film 3, a protecting layer 4, and an external electrode 5.

A plurality of dielectric thin films 2 and a plurality of internal electrode thin films 3 are alternately disposed on the silicon substrate 1, and a material of the silicon substrate 1 is formed of silicon Si. That this, the plurality of dielectric thin films 2 and the plurality of internal electrode thin films 3 are alternately disposed on the silicon substrate 1 to have a multilayer structure. The protecting layer 4 is formed on the dielectric thin film 2 that is positioned on an outside among the plurality of dielectric thin films 2 to protect the dielectric thin films 2 from an outside environment. The external electrode 5 is connected to contact with exposed intersections of the internal electrode thin films 3 alternately disposed on the substrate 1, to thereby configure a plurality of condenser circuits including the dielectric thin films 2 and the internal electrode thin films 3.

The conventional multilayer thin film capacitor may become thinned by manufacturing the dielectric thin film 2 and the internal electrode thin film as a thin film using the thin film manufacturing method, and may be embedded in a conductive inter-layer pad (not shown) of a printed circuit board (not shown) and thereby be mounted as a soldering 7 as shown in FIG. 2. When the printed circuit board is bent in a state where the multilayer thin film capacitor is embedded in the printed circuit board, a crack 6 may occur in a portion contacting with the soldering 7 since the silicon substrate 1 is applied. The crack 6 may cause a short phenomenon in which the plurality of internal electrode thin films 3 may be electrically connected.

The conventional multilayer thin film capacitor is formed of a material such as silicon. Therefore, when the printed circuit board is bent in a state where the multilayer thin film capacitor is embedded in the printed circuit board, a crack may occur in the multilayer thin film capacitor. Accordingly, there is a problem that a short of electrically connecting internal electrodes may occur due to the crack, thereby degrading the product reliability.

SUMMARY OF THE INVENTION

The present invention is conceived to solve the aforementioned problems and thus, provides a flexible multilayer thin film capacitor that may employ a flexible metal substrate and thus, be available even in a harsh environment where a printed circuit board may be bent in a state where the flexible multilayer thin film capacitor is mounted to be embedded in the printed circuit board, and an embedded printed circuit board using the same.

The present invention also provides a flexible multilayer thin-film capacitor that may employ a flexible metal substrate and thus, prevent a crack occurring due to bending of a printed circuit board in a state where the flexible multilayer thin film capacitor is mounted to be embedded in the printed circuit board, and thereby may enhance the reliability, and an embedded printed circuit board using the same.

According to an aspect of the present invention, there is provided a flexible multilayer thin film capacitor including: a metal substrate; a metal oxide layer formed on the whole surface of the metal substrate; a plurality of first internal electrode layers selectively applied on a first surface of the metal substrate using a metal material; a plurality of dielectric layers formed to be sequentially multilayered on the whole surface of the first internal electrode layers using a dielectric material; a plurality of second internal electrode layers selectively applied on the dielectric layers using a metal material; a protecting layer applied on a surface of one of the plurality of second internal electrode layers; and a single pair of external electrodes connected to contact with the plurality of first internal electrode layers and the plurality of second internal electrode layers, respectively, and soldered on conductive inter-layer pads of a printed circuit board. One of the plurality of first internal electrode layers may be formed on the metal oxide layer formed on the first surface of the metal substrate.

According to another aspect of the present invention, there is provided an embedded printed circuit board using a flexible multilayer thin film capacitor, including: the flexible multilayer thin film capacitor; and a printed circuit board in which the flexible multilayer thin film capacitor is mounted to be embedded.

The flexible multilayer thin film capacitor may include a metal substrate, a metal oxide layer formed on the whole surface of the metal substrate, a plurality of first internal electrode layers selectively applied on a first surface of the metal substrate using a metal material, a plurality of dielectric layers formed to be sequentially multilayered on the whole surface of the first internal electrode layers using a dielectric material, a plurality of second internal electrode layers selectively applied on the dielectric layer using a metal material, a protecting layer applied on a surface of one of the plurality of second internal electrode layers, and a single pair of external electrodes connected to contact with the plurality of first internal electrode layers and the plurality of second internal electrode layers, respectively, and soldered on conductive inter-layer pads of a printed circuit board, and one of the plurality of first internal electrode layers may be formed on the metal oxide layer formed on the first surface of the metal substrate.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION OF THE INVENTION

Figure 1:
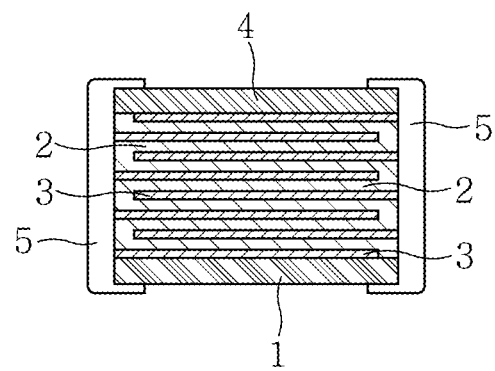
FIG. 1 is a cross-sectional view of a conventional multi-layer thin film capacitor.
Figure 2:
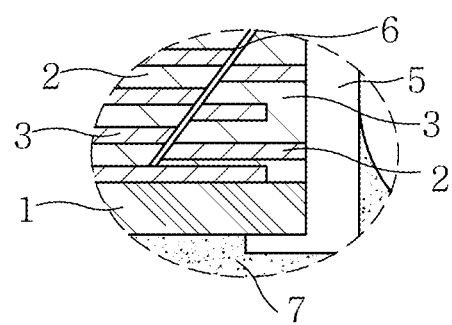
FIG. 2 is a view illustrating a portion where a crack occurs in a multilayer thin film capacitor.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Hereinafter, a flexible multilayer thin film capacitor of the present invention and an embedded printed circuit board using the same will be described with reference to the accompanying drawings.

Figure 3:
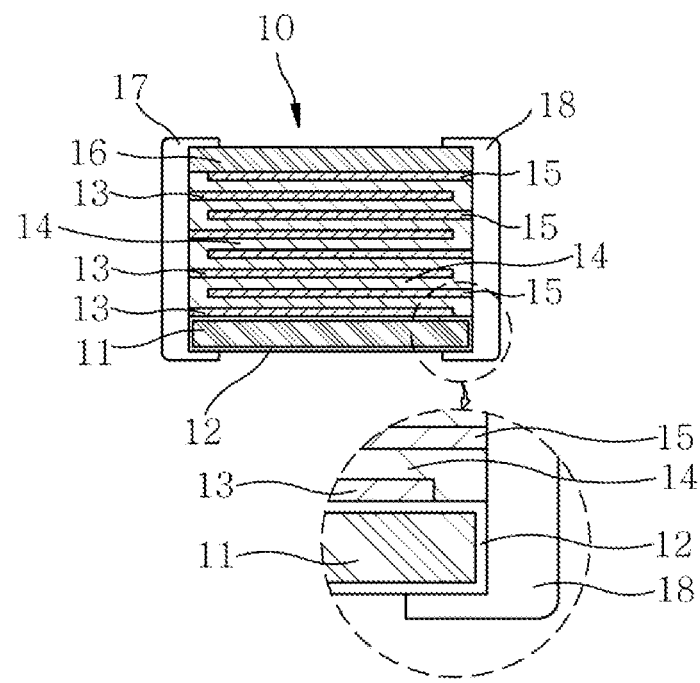
FIG. 3 is a cross-sectional view of a metal substrate in a flexible multilayer thin film capacitor of the present invention.

As shown in FIG. 3, a flexible multilayer thin film capacitor 10 of the present invention may include a metal substrate 11, a metal oxide film 12, a plurality of first internal electrode layers 13, a plurality of dielectric layers 14, a plurality of second internal electrode layers 15, a protecting layer 16, a first external electrode 17, and a second external electrode 18. Each configuration thereof will be described as follows.

The metal substrate 11 is used as a base substrate of the flexible multilayer thin film capacitor 10 of the present invention, the metal oxide layer 12 is formed on the whole surface of the metal substrate 11 using one of an anodization scheme, a deposition scheme, and an impregnation scheme in order to apply insulation thereon, and each of the plurality of first internal electrode layers 13 is selectively applied on a first surface of the metal substrate 11 using a metal material. One of the plurality of first internal electrode layers 13 may be formed on the metal oxide layer 12 formed on the first surface of the metal substrate 11. The plurality of dielectric layers 14 may be formed to be sequentially multi-layered on the whole surface of the first internal electrode layers 13 using a dielectric material, and the plurality of second internal electrode layers 15 may be selectively applied on the dielectric layers 14 using a metal material. The protecting layer 16 may be applied on a surface of one of the plurality of second internal electrode layers 15, and a single pair of external electrodes 17 and 18 may be connected to contact with the plurality of first internal electrode layers 13 and the plurality of second internal electrode layers 15, respectively, and be soldered on conductive inter-layer pads 32 of the printed circuit board 30.

Hereinafter, a configuration of the flexible multilayer thin film capacitor 10 of the present invention constructed as above will be described with reference to FIGS. 4 through 10.

Figure 4:
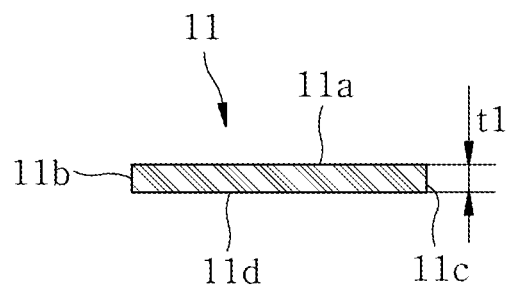
FIGS. 4 through 10 are cross-sectional views to describe a process of manufacturing the flexible multilayer thin film capacitor of FIG. 3.

As shown in FIG. 4, the metal substrate 11 is used as a base substrate of the flexible multilayer thin film capacitor 10 of the present invention. By employing, as the base substrate, the metal substrate 11 instead of using a conventional silicon substrate, flexibility may increase compared to the silicon substrate whereby it is possible to prevent a crack occurring due to bending of a printed circuit board (not shown) in a state where the flexible multilayer thin film capacitor 10 is mounted to be embedded in the printed circuit board. The metal substrate 11 may select and use one of aluminum (Al), cupper (Cu), silver (Ag), nickel (Ni), niobium (Nb), tantalum (Ta), zirconium (Zr), and titanium (Ti) that have flexibility and a thickness t1 of the metal substrate 11 may be 10 μm to 1000 μm.

Figure 5:
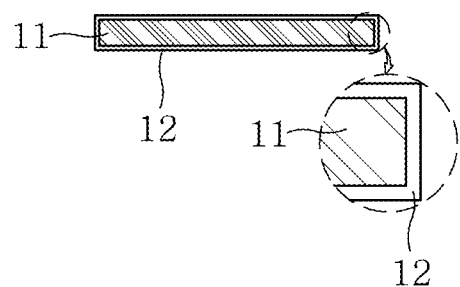

As shown in FIG. 5, the metal oxide layer 12 may be formed on the whole surface including a first surface 11a, a second surface 11b, a third surface 11c, a fourth surface 11d, and a fifth surface 11e of the metal substrate 11 using one of an anodization scheme, a deposition scheme, and an impregnation scheme. For example, when the metal substrate 11 is a hexahedron, the metal oxide layer 12 may be formed on each surface thereof whereby it is possible to prevent the first external electrode 17, electrically connecting the plurality of first internal electrode layers 13, from being electrically connected to the second external electrode 18 electrically connecting the plurality of second internal electrode layers 15, thereby being shorted.

Since the metal oxide layer 12 is formed using one of the anodization scheme, the deposition scheme, and the impregnation scheme, a material of the metal oxide layer 12 may be dependent on a material of the metal substrate 11 and thereby be formed, and may use one of alumina (Al2O3), niobium oxide (Nb2O5), niobium monoxide (NbO), tantalum oxide (Ta2O5), zirconium oxide (ZrO2), and titanium oxide (TiO2). For example, when aluminum (Al) is used for the metal substrate 11, the material of the metal oxide layer 12 may be formed by anodizing aluminum (Al) and thus become dependent on the material of the metal substrate 11 and use alumina (Al2O3).

Figure 6:
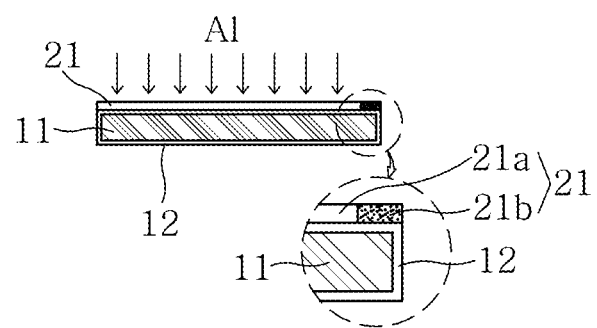
Figure 7:
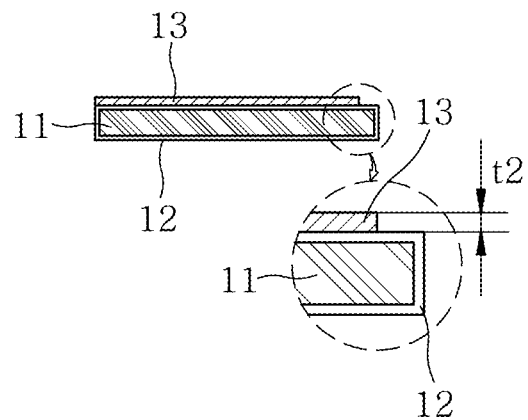

To be manufactured as a thin film, as shown in FIGS. 6 and 7, the plurality of first internal electrode layers 13 may use one of a sputtering scheme, a thermal deposition scheme, and a chemical vapor deposition (CVD) scheme, and a thickness t2 of the first internal electrode layer 13 may be 100 Å to 5000 Å. A material of each of the plurality of first internal electrode layers 13 may use one of aluminum (Al), gold (Au), platinum (Pt), silver (Ag), cupper (Cu), chrome (Cr), and zinc (Zn).

For example, as shown in FIG. 6, when the metal oxide layer 12 is formed on the metal substrate 11, the first internal electrode layer 13 may be formed by forming a mask pattern 21 on the metal oxide layer 12 formed on the first surface 11a of the metal substrate 11 and then applying aluminum (Al) on an area 21a excluding an area 21b of the mask pattern 21 using one of a deposition scheme, a spraying scheme, and a sputtering scheme. The area 21b of the mask pattern 21 may be a masking area to prevent the plurality of first internal electrode layers 13 from being electrically connected to the first electrode 17.

Figure 8:
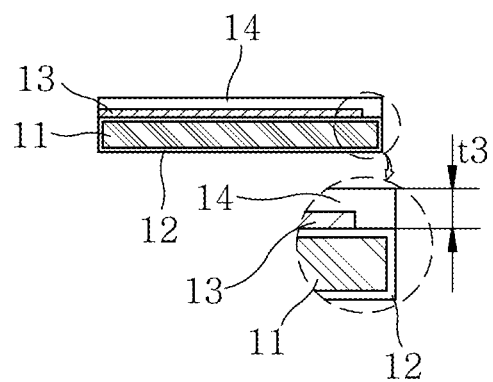

As shown in FIG. 8, the plurality of dielectric layers 14 may be sequentially on the whole surface of the plurality of first internal electrode layers 13 to be multi-layered thereon through spraying or deposition, and may be formed using one of a spin coating, a sputtering scheme, a thermal deposition scheme, a CVD scheme, and a screen printing method. A dielectric material may use sol, gas, paste, or target state. Each of the plurality of dielectric layers 14 may be formed between the first internal electrode layer 13 and the second internal electrode layer 15 to thereby prevent the first internal electrode layer 13 and the second internal electrode layer 15 from being electrically connected to each other. Each of the plurality of dielectric layers 14 may be formed to have a thickness t3 of 100 Å to 10000 Å in a portion where each of the plurality of dielectric layers 14 is formed between the first internal electrode layer 13 and the second internal electrode layer 15, and a material thereof may use one of BaTiO3, (BaSr)TiO3, CaTiO3, SrTiO3, CaZrO3, Pb(ZrTi)O3, and Al2O3, and may use all of the materials indicating a dielectric property.

Figure 9:
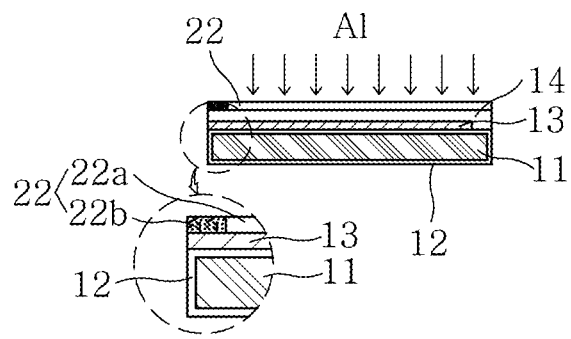
Figure 10:
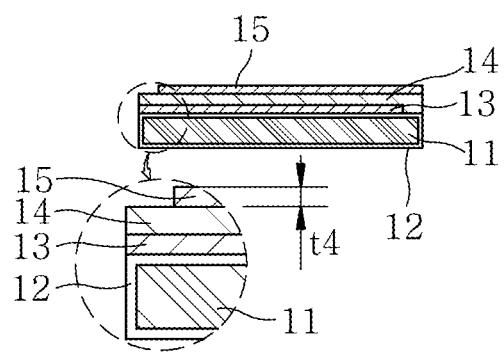

As shown in FIGS. 9 and 10, each of the plurality of second internal electrode layers 15 may be formed using one of a sputtering scheme, a thermal deposition scheme, and a CVD scheme to be selectively and sequentially multi-layered on the dielectric layers 14. A thickness t4 of each of the plurality of second internal electrode layers 15 may be formed to be 100 Å to 5000 Å. A material of each of the plurality of second internal electrode layers 15 may use one of aluminum (Al), gold (Au), platinum (Pt), silver (Ag), cupper (Cu), chrome (Cr), zinc (Zn), and tin (Sn).

For example, as shown in FIG. 9, when the dielectric layer 14 is formed, the second internal electrode layer 15 may be formed by forming a mask pattern 22 on the surface of the dielectric layer 14 and by applying aluminum (Al) on an area 22a excluding an area 22b of the mask pattern 22 using one of deposition, spraying, and sputtering. The area 22b of the mask pattern 22 may be a masking area to prevent the second internal electrode layer 15 from being electrically connected to the second external electrode 18. Here, each of the mask patterns 21 and 22 may use a photo etching process using a sensitizing solution or a metal mask pattern.

The protecting layer 16 may be formed to protect the flexible multilayer thin film capacitor 10 of the present invention from an outside environment, and may include an insulating material such as alumina (Al2O3) or polymer.

As shown in FIG. 3, a single pair of external electrodes may include the first external electrode 17 and the second external electrode 18. The first external electrode 17 may be formed on the protecting layer 16, the plurality of first internal electrode layers 13, and the metal oxide layer 12 formed on the second surface 11b and the fourth surface 11d of the metal substrate 11 to thereby be electrically connected to the plurality of first internal electrode layers 13, and may be connected to the conductive inter-layer pad 32 of the printed circuit board 30 as soldering as shown in FIG. 11.

Figure 11:
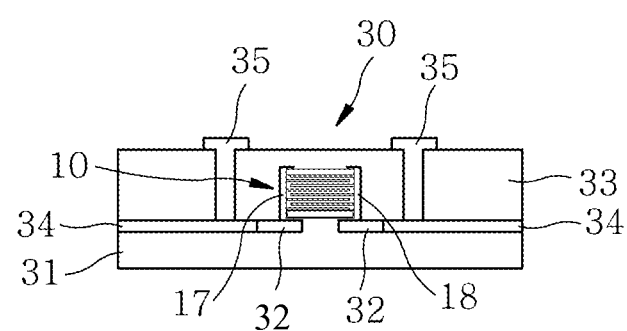
FIG. 11 is a cross-sectional view of an embedded printed circuit board using a flexible multilayer thin film capacitor according to an embodiment of the present invention.

The second external electrode 18 may be formed on the protecting layer 16, the plurality of second internal electrode layers 15, and the metal oxide film 12 formed on the third surface 11c and the fourth surface 11d of the metal substrate 11 to not be connected to the first external electrode 17, thereby being electrically connected to the plurality of second internal electrode layers 15, and may be connected to the conductive inter-layer pad 32 of the printed circuit board 30 as soldering as shown in FIG. 11.

An embedded printed circuit board using a flexible multilayer thin film capacitor of the present invention constructed as above may include a flexible multilayer thin film capacitor 10 and a printed circuit board 30 as shown in FIG. 11.

The flexible multilayer thin film capacitor 10 is the same as the aforementioned embodiment and thus, description related thereto will be omitted here. The printed circuit board 30 may include a first resin layer 31, a single pair of conductive inter-layer pads 32, a second resin layer 33, a plurality of conductive layers 34 using a conductive material, for example, cupper (Cu), and a plurality of via members 35.

The first resin layer 31 may support the printed circuit board 30 overall, the single pair of conductive inter-layer pads 32 may be applied to the first resin layer 31 to be spaced part from each other, and a single pair of external electrodes, that is, the first external electrode 17 and the second external electrode 18 may be attached and thereby be mounted thereto using a soldering scheme. The second resin layer 33 may be formed on the first resin layer 31 to embed the conductive inter-layer pad 32 and the flexible multilayer thin film capacitor 10. The plurality of conductive layers 34 may be formed on the first resin layer 31 and thereby be connected to the conductive inter-layer pads 32, respectively. The plurality of via members 35 may be connected to the conductive layers 34, respectively, and be connected to the conductive inter-layer pads 32 using soldering to thereby enable an electrical signal of the embedded flexible multilayer thin film capacitor 10 to be input to and output from an electronic part (not shown) mounted on the surface of the printed circuit board 30.

As described above, in the flexible multilayer thin film capacitor of the present invention and the embedded printed circuit board using the same, in a state where the first external electrode 17 and the second external electrode 18 are attached to the single pair of the conductive inter-layer pads 31 of the printed circuit board 30, respectively, using soldering and thereby are embedded therein, the metal substrate 11 may be applied as the base substrate. Accordingly, it is possible to prevent a crack occurring due to bending of the printed circuit board 30, and to improve the reliability of a product.

What is claimed is:

1. A flexible multilayer thin film capacitor, comprising:
   a metal substrate having an outer surface, the outer surface including a top surface on top of the metal substrate, side surfaces on sides of the metal substrate and a bottom surface on bottom of the metal substrate;
   a metal oxide layer formed on the whole outer surface of the metal substrate to electrically insulate the metal substrate, the metal oxide layer including a top oxide layer, side oxide layers and a bottom oxide layer;
   a first internal electrode layer formed on the top oxide layer, the first internal electrode layer being formed of a metallic material;
   a dielectric layer formed on the first internal electrode layer, the dielectric layer being formed of a dielectric material;
   a second internal electrode layer formed on the dielectric layer, the second internal electrode layer being formed of a metallic material;
   a protecting layer formed on the second internal electrode layer;
   a first external electrode electrically connected to the first internal electrode layer, but not the second electrode layer; and
   a second external electrode electrically connected to the second internal electrode layer, but not the first electrode layer, wherein the first and second external electrodes are disposed substantially perpendicular to the metal substrate, extended underneath the metal substrate and electrically insulated from the metal substrate by the side oxide layers and the bottom oxide layer, and wherein the extended portions of the first and second electrodes are configured to be soldered on conductive inter-layer pads of a printed circuit board.

2. The flexible multilayer thin film capacitor of claim 1, wherein the metal substrate is formed using one of an anodization scheme, a deposition scheme, and an impregnation scheme, and the metallic material includes one of aluminum (Al), cupper (Cu), silver (Ag), nickel (Ni), niobium (Nb), tantalum (Ta), zirconium (Zr), and titanium (Ti).

3. The flexible multilayer thin film capacitor of claim 1, wherein the metal substrate has a thickness of from 10 μm to 1000 μm.

4. The flexible multilayer thin film capacitor of claim 1, wherein the metal oxide layer is formed of one of alumina (Al$_2$O$_3$), copper oxide (CuO), silver oxide (AgO), nickel oxide (NiO), niobium oxide (Nb$_2$O$_5$), niobium monoxide (NbO), tantalum oxide (Ta$_2$O$_5$), zirconium oxide (ZrO$_2$), and titanium oxide (TiO$_2$).

5. The flexible multilayer thin film capacitor of claim 1, wherein the first and second internal electrode layers are formed using one of a sputtering scheme, a thermal deposition scheme, a chemical vapor deposition (CVD) scheme, and a screen printing scheme.

6. The flexible multilayer thin film capacitor of claim 1, wherein the first and second internal electrode layers have a thickness of 100 Å to 5000 Å.

7. The flexible multilayer thin film capacitor of claim 1, wherein the first and second internal electrode layers are formed of one of aluminum (Al), gold (Au), platinum (Pt), silver (Ag), cupper (Cu), chrome (Cr), zinc (Zn), and tin (Sn).

8. The flexible multilayer thin film capacitor of claim 1, wherein the dielectric material includes one of BaTiO$_3$, (BaSr)TiO$_3$, CaTiO$_3$, SrTiO$_3$, CaZrO$_3$, Pb(ZrTi)O$_3$, and Al$_2$O$_3$.

9. The flexible multilayer thin film capacitor of claim 1, wherein the dielectric layer is formed using one of a spin coating scheme, a sputtering scheme, a thermal deposition scheme, a CVD scheme, and a screen printing scheme.

10. The flexible multilayer thin film capacitor of claim 1, wherein the dielectric layer has a thickness of 100 Å to 10000 Å.

11. The flexible multilayer thin film capacitor of claim 1, wherein the protecting layer is formed of an insulating material.

12. A printed circuit board embedding a flexible multilayer thin film capacitor of claim 1.

* * * * *